US012336258B2

(12) United States Patent
Wu et al.

(10) Patent No.: US 12,336,258 B2
(45) Date of Patent: Jun. 17, 2025

(54) SEMICONDUCTOR STRUCTURE

(71) Applicant: Taiwan Semiconductor Manufacturing Company, Ltd., Hsinchu (TW)

(72) Inventors: Yen-Ching Wu, Taoyuan (TW);
Chung-Kai Lin, Taipei (TW);
Kuan-Lun Cheng, Hsin-Chu (TW);
Wen-Chien Lin, Taoyuan (TW);
Chih-Ling Hsiao, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 484 days.

(21) Appl. No.: 17/727,846

(22) Filed: Apr. 25, 2022

(65) Prior Publication Data
US 2023/0343840 A1 Oct. 26, 2023

(51) Int. Cl.
*H10D 64/23* (2025.01)
*H10D 30/01* (2025.01)
(Continued)

(52) U.S. Cl.
CPC ......... *H10D 64/258* (2025.01); *H10D 30/024* (2025.01); *H10D 30/6211* (2025.01); *H10D 30/6219* (2025.01); *H10D 64/01* (2025.01)

(58) Field of Classification Search
CPC ..... H01L 21/823431; H01L 21/823821; H01L 21/845; H01L 27/0886; H01L 27/0924; H01L 27/1211; H01L 29/41791; H01L 29/66795–66818; H01L 29/785–7856; H01L 2029/7857–7858;
(Continued)

(56) References Cited

U.S. PATENT DOCUMENTS 8,772,109 B2  7/2014  Colinge
8,785,285 B2  7/2014  Tsai et al.
(Continued)

OTHER PUBLICATIONS

M. Alioto, "Analysis of layout density in FinFET standard cells and impact of fin technology," Proceedings of 2010 IEEE International Symposium on Circuits and Systems, Paris, France, 2010, pp. 3204-3207, doi: 10.1109/ISCAS.2010.5537930 (Year: 2010).*

*Primary Examiner* — Evren Seven
*Assistant Examiner* — Cole Leon Lindsey
(74) *Attorney, Agent, or Firm* — JCIPRNET

(57) ABSTRACT

A semiconductor structure includes an insulator, a semiconductor fin, a gate stack, a gate contact, a source/drain material, and a source/drain contact structure. The semiconductor fin protrudes from the insulator. The gate stack is disposed on the semiconductor fin and the insulator. The gate contact is disposed on and electrically connected to the gate stack. The source/drain material is disposed on the semiconductor fin. The source/drain contact structure is disposed on and electrically connected to the source/drain material. The semiconductor fin extends along a first direction, the gate stack extends along a second direction different from the first direction. An offset S in the second direction between the gate contact and the source/drain contact structure satisfies: 0<S≤(W/2+D/2), wherein W is a width of the semiconductor fin, and D is a dimension of the gate contact.

20 Claims, 16 Drawing Sheets

(51) Int. Cl.
*H10D 30/62* (2025.01)
*H10D 64/01* (2025.01)

(58) Field of Classification Search
CPC ... H01L 2924/13067; H01L 29/04–045; H01L 29/16–1608; H01L 29/22–2206; H10B 12/36; H10B 12/056

See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2014/0312413 A1* | 10/2014 | Guo .................. H10D 30/01 257/330 |
| 2020/0168723 A1* | 5/2020 | Hsu .................. H10D 30/024 |

* cited by examiner

SEMICONDUCTOR STRUCTURE

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and finFETs.

Such scaling down has increased the complexity of semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
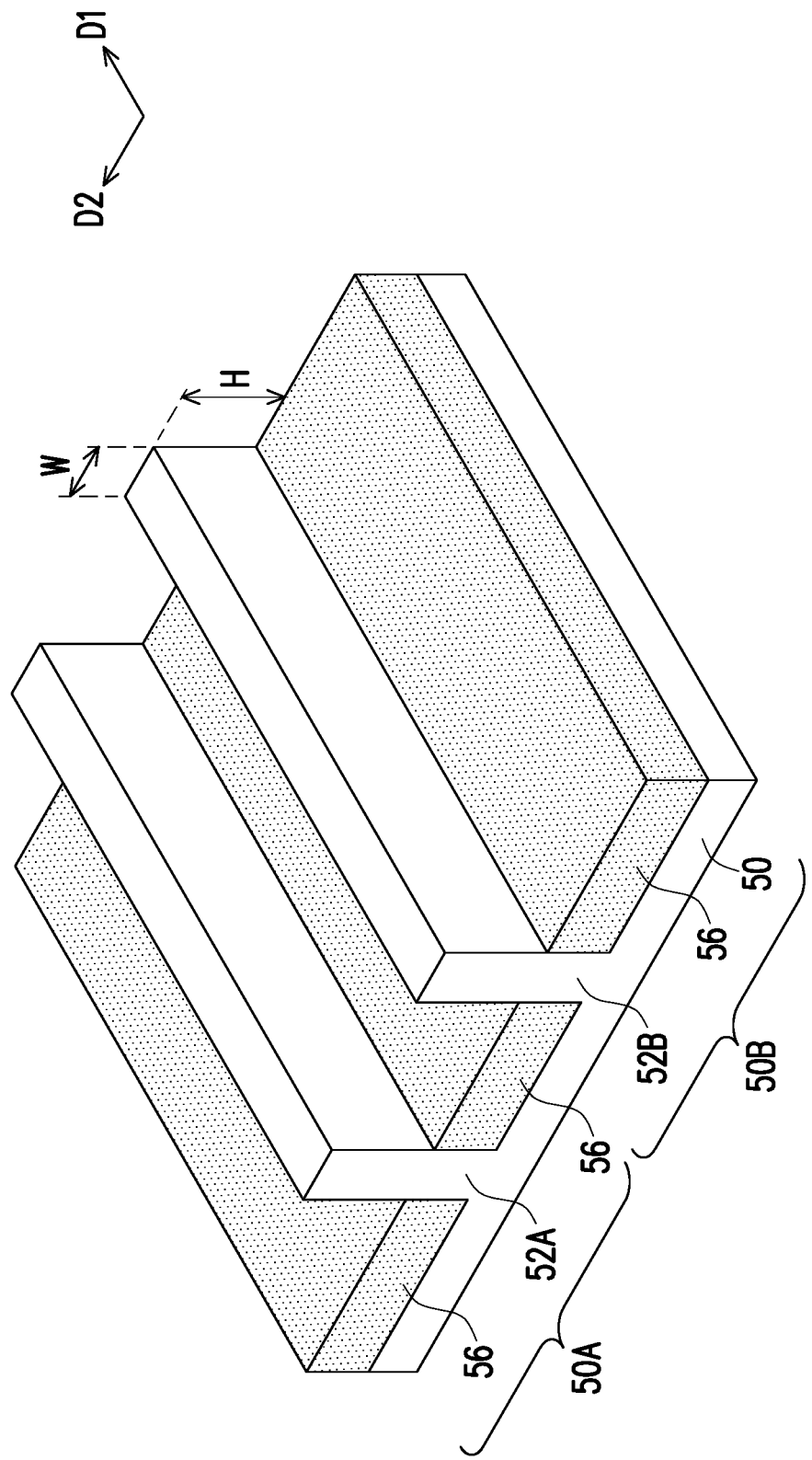
FIGS. 1, 2 and 3A are three-dimensional views of intermediate stages in the manufacturing of the semiconductor structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Figure 2:
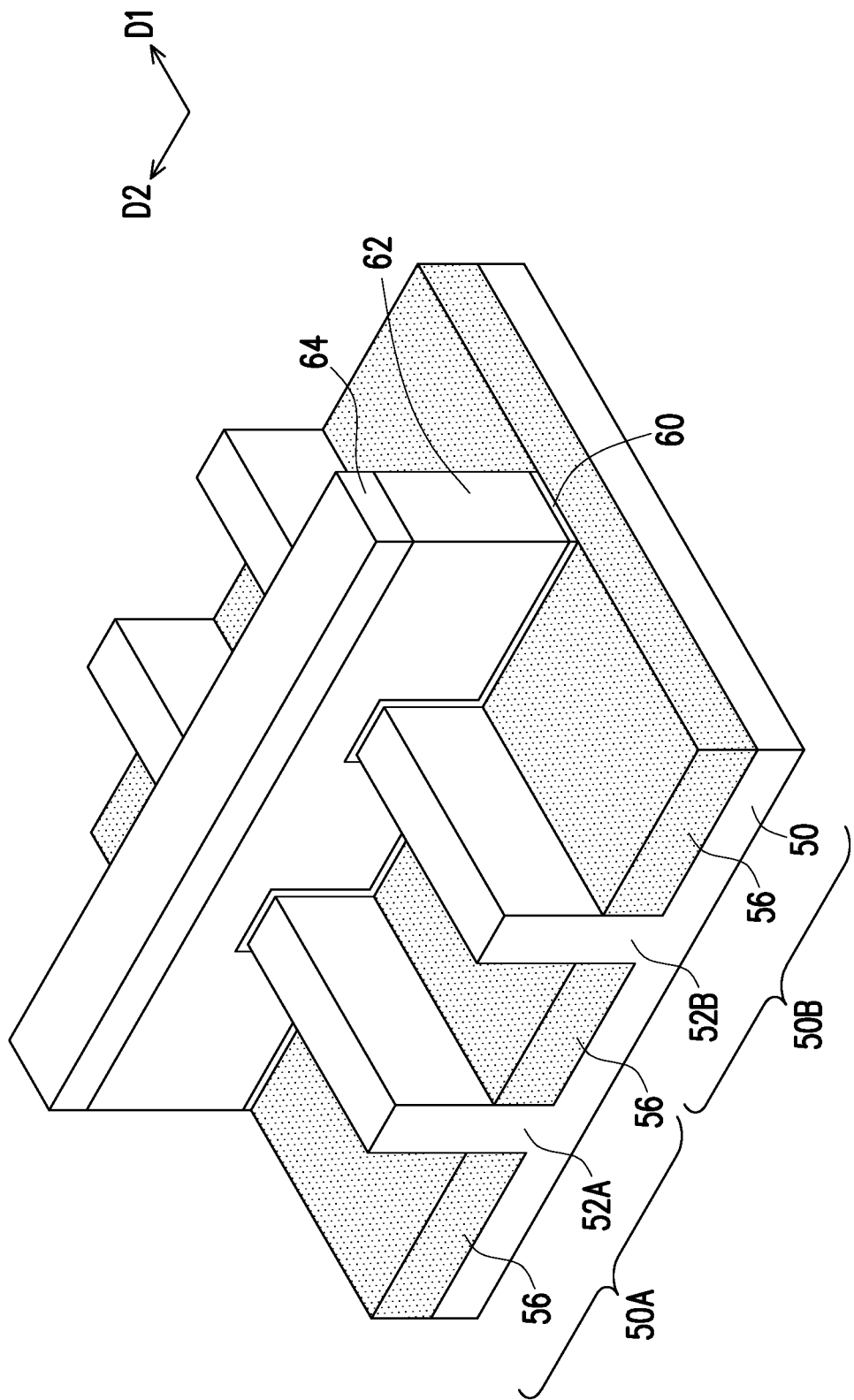

FIGS. 1 through 10B are various views of intermediate stages in the manufacturing of the semiconductor structure, e.g., FinFETs, in accordance with some embodiments. FIGS. 1, 2 and 3A are three-dimensional views. As shown in FIG. 3A, cross-section A-A is along a longitudinal axis of the semiconductor fin 52A between the source/drain materials 70A and 70B, and cross-section B-B is perpendicular to cross-section A-A and extends through the source/drain materials 70A and 70B. FIGS. 3B, 4A, 6A, 7A, 8A, 9A, and 10A are cross-sectional views illustrated along reference cross-section A-A in FIG. 3A. FIGS. 3C, 4B, 4C, 6B, 7B, 8B, 9B, and 10B are cross-sectional views illustrated along reference cross-section B-B in FIG. 3A.

In FIG. 1, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50A and a region 50B. The region 50A can be for forming n-type devices, such as NMOS transistors, e.g., n-type FinFETs. The region 50B can be for forming p-type devices, such as PMOS transistors, e.g., p-type FinFETs. However, the types of the devices are not limited in the present disclosure. The region 50A may be physically separated from the region 50B, and any number of device features (e.g., other active devices, doped regions, isolation structures, etc.) may be disposed between the region 50A and the region 50B. For brevity, only region 50A is shown in FIGS. 3B through 10B. However, similar process may also be performed in region 50B.

Fins 52A and 52B are formed extending from the substrate 50. The fins 52A and 52B are semiconductor strips. In some embodiments, the fins 52A and 52B may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52A and 52B have a width W. The width W can be in the range of about 3 nm to about 30 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions (insulator) 56 are formed over the substrate 50 and between neighboring fins, e.g., fins 52A and 52B. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52A and 52B. Some embodiments may utilize multiple layers. For example, in some embodiments a liner (not shown) may first be formed along a surface of the substrate 50 and the fins 52A and 52B. Thereafter, a fill material, such as those discussed above may be formed over the liner. A removal process is applied to the insulation material to remove excess insulation material over the fins 52A and 52B. In some embodiments, a planarization process such as a chemical mechanical polish (CMP), an etch back process, combinations thereof, or the like may be utilized. The planarization process exposes the fins 52A and 52B such that top surfaces of the fins 52A and 52B and the insulation material are level after the planarization process is complete. The insulation material is then recessed, with remaining portions of the insulation material forming the STI regions 56. The insulation material is recessed such that upper portions of fins 52A and 52B in the region 50A and in the region 50B protrude from between neighboring STI regions 56. After the recessing, exposed portions of the fins 52A and 52B extend a height H above top surfaces of the STI regions 56. In some embodiments, the height H can be greater than about 40 nm, such as in the range of about 50 nm to about 80 nm. In some embodiments, the height H can be in the range of about 15 nm to about 50 nm. The exposed portions of the fins 52A and 52B include what will be channel regions of the resulting FinFETs. The process described above is just one example of how the fins 52A and 52B may be formed and is not intended to be limiting.

Further, appropriate wells (not shown) may be formed in the fins 52A and 52B and/or the substrate 50. In some embodiments, a P well may be formed in the region 50A, and an N well may be formed in the region 50B. In some embodiments, a P well or an N well are formed in both the region 50A and the region 50B. In the embodiments with different well types, the different implant steps for the region 50A and the region 50B may be achieved using a photoresist or other masks (not shown). The n-type impurities may be phosphorus, arsenic, antimony, or the like implanted in the region to a concentration of equal to or less than $10^{18}$ cm$^{-3}$, such as between about $10^{17}$ cm$^{-3}$ and about $10^{18}$ cm$^{-3}$. The p-type impurities may be boron, BF2, indium, or the like implanted in the region to a concentration of equal to or less than $10^{18}$ cm$^{-3}$, such as between about $10^{17}$ cm$^{-3}$ and about $10^{18}$ cm$^{-3}$.

In FIG. 2, dummy gate dielectrics 60 are formed over the fins 52A and 52B and dummy gates 62 are formed over the dummy gate dielectrics 60. The dummy gate dielectrics 60 and dummy gates 62 may be collectively referred to as "dummy gate stacks," with each dummy gate stack including a dummy gate dielectric 60 and a dummy gate 62. The dummy gate stacks extend along sidewalls of the fins 52A and 52B. Although only one dummy gate stack is illustrated in FIG. 2, it should be appreciated that multiple dummy gate stacks are simultaneously formed, and each fin may have multiple dummy gate stacks formed thereon (as shown in FIG. 3B).

As an example of forming the dummy gate dielectrics 60 and dummy gates 62, a dummy dielectric layer is formed on the fins 52A and 52B. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), polycrystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the region 50A and the region 50B. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form dummy gates 62. The pattern of the masks 64 is further transferred to the dummy dielectric layer to form dummy gate dielectrics 60. The dummy gates 62 cover respective channel regions 58 of the fins 52A and 52B (as can be seen in FIG. 3B). The pattern of the masks 64 may be used to physically separate each of the dummy gates 62 from adjacent dummy gates. The dummy gates 62 may also have a lengthwise direction substantially perpendicular to the lengthwise direction of respective fins 52A and 52B.

Figure 3A:
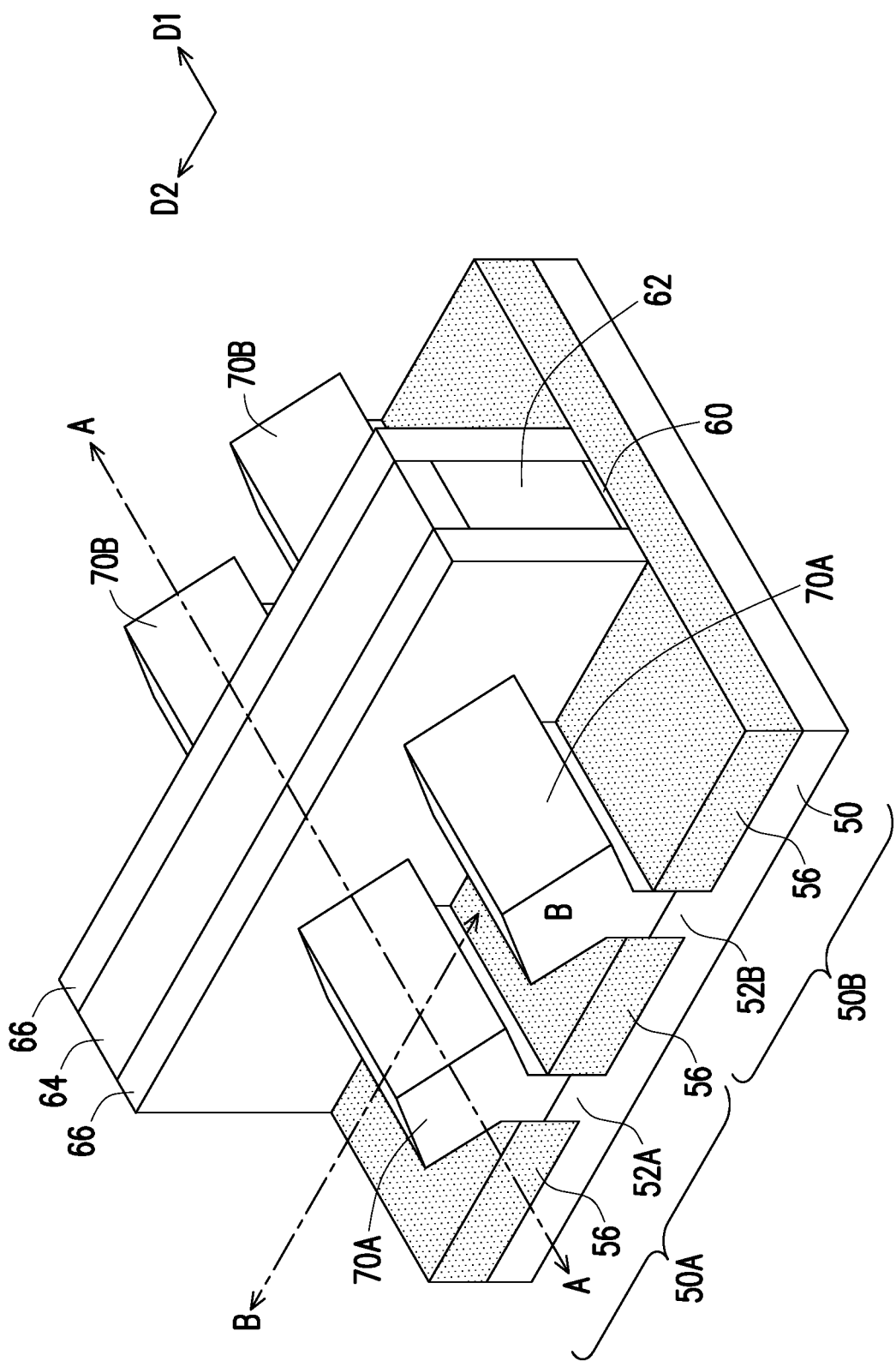
Figure 3C:
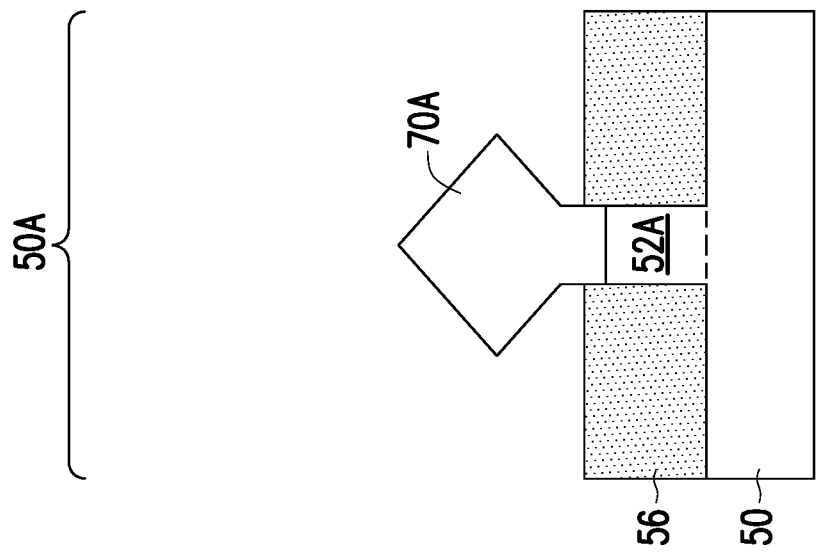
FIGS. 3B and 3C are cross-sectional views of the intermediate stage shown in FIG. 3A, in accordance with some embodiments.
Figure 3B:
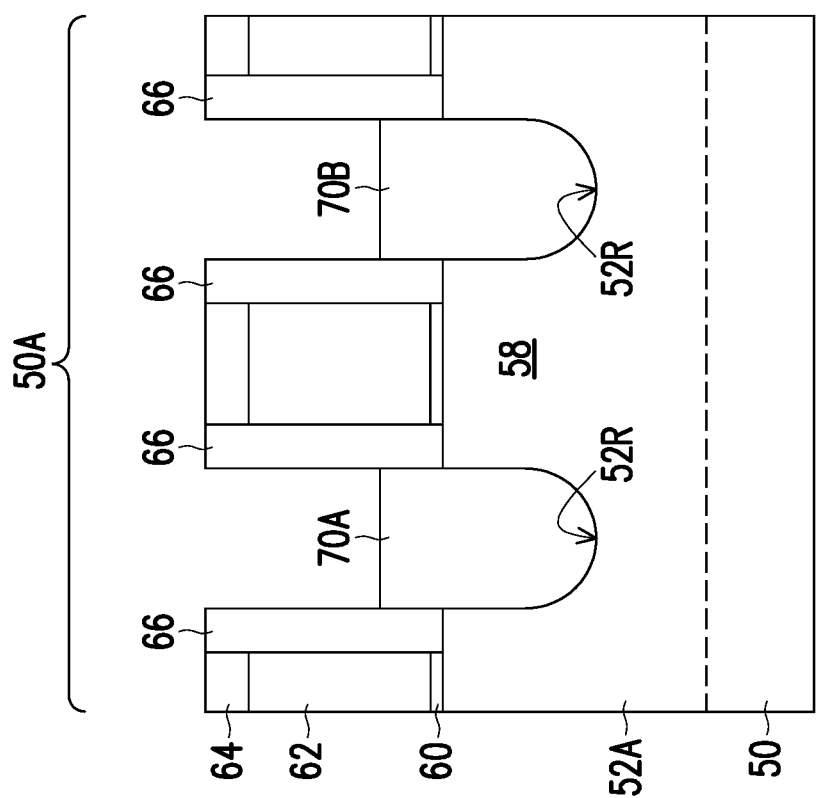

In FIGS. 3A through 3C, gate spacers 66 are formed on exposed surfaces of the dummy gates 62, the masks 64, and/or the fins 52A and 52B. The gate spacers 66 may be formed by conformally depositing an insulating material and subsequently etching the insulating material. The insulating material of the gate spacers 66 may be silicon nitride, silicon oxide, silicon carbonitride, silicon oxycarbonitride, a combination thereof, or the like. In some embodiments (not shown), the gate spacers 66 are formed from a multi-layered insulating material, and include multiple layers. For example, the gate spacers 66 may include a layer of silicon oxide disposed between two layers of silicon nitride, or may include multiple layers of silicon oxycarbonitride.

Epitaxial source/drain materials 70A and 70B are then formed on the fins 52A and 52B to exert stress in the channel regions 58, thereby improving performance. The epitaxial source/drain materials 70A and 70B are formed on the fins 52A and 52B such that each dummy gate 62 is disposed between respective neighboring pairs of the epitaxial source/drain materials 70A and 70B. In some embodiments the epitaxial source/drain materials 70A and 70B may extend into, and may also penetrate through the fins 52A and 52B. In some embodiments, the gate spacers 66 are used to separate the epitaxial source/drain materials 70A and 70B from the dummy gates 62 by an appropriate lateral distance so that the epitaxial source/drain materials 70A and 70B do not short out subsequently formed gates of the resulting FinFETs.

The epitaxial source/drain materials 70A and 70B may be formed by etching source/drain regions of the fins 52A and 52B to form recesses 52R in the fins 52A and 52B. Then, the epitaxial source/drain materials 70A and 70B are epitaxially grown in the recesses 52R. In some embodiments, the epitaxial source/drain materials 70A and 70B may include any acceptable material, such as appropriate for n-type FinFETs. For example, if the fins 52A and 52B are silicon, the epitaxial source/drain materials 70A and 70B may include materials exerting a tensile strain in the channel regions 58, such as silicon, silicon carbide, phosphorous doped silicon carbide, silicon phosphide, or the like. In some other embodiments, the epitaxial source/drain materials 70A and 70B may include any acceptable material, such as appropriate for p-type FinFETs. For example, if the fins 52A and 52B are silicon, the epitaxial source/drain materials 70A and 70B may comprise materials exerting a compressive strain in the channel regions 58, such as silicon germanium, germanium, germanium tin, or the like. The epitaxial source/drain materials 70A and 70B may have surfaces raised from respective surfaces of the fins 52A and 52B and may have facets. In some embodiments, as illustrated by FIG. 3A, adjacent epitaxial source/drain materials 70A and 70B remain separated after the epitaxy process is completed.

The epitaxial source/drain materials 70A and 70B and/or the fins 52A and 52B may be doped with impurities to form source/drain regions. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. The epitaxial source/drain materials 70A and 70B are in situ doped during growth. Doping during growth instead of by implantation can avoid stress relaxation in the channel regions 58 that occurs during dopant implantation. Performance of the resulting FinFETs may thus be improved.

Figure 4B:
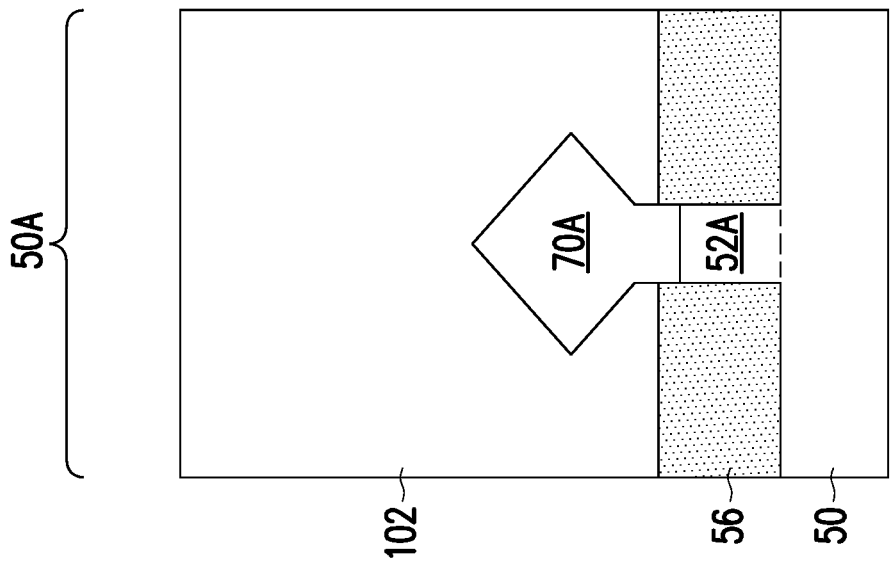
FIGS. 4A through 10B are cross-sectional views of further intermediate stages in the manufacturing of the semiconductor structure, in accordance with some embodiments.
Figure 4A:
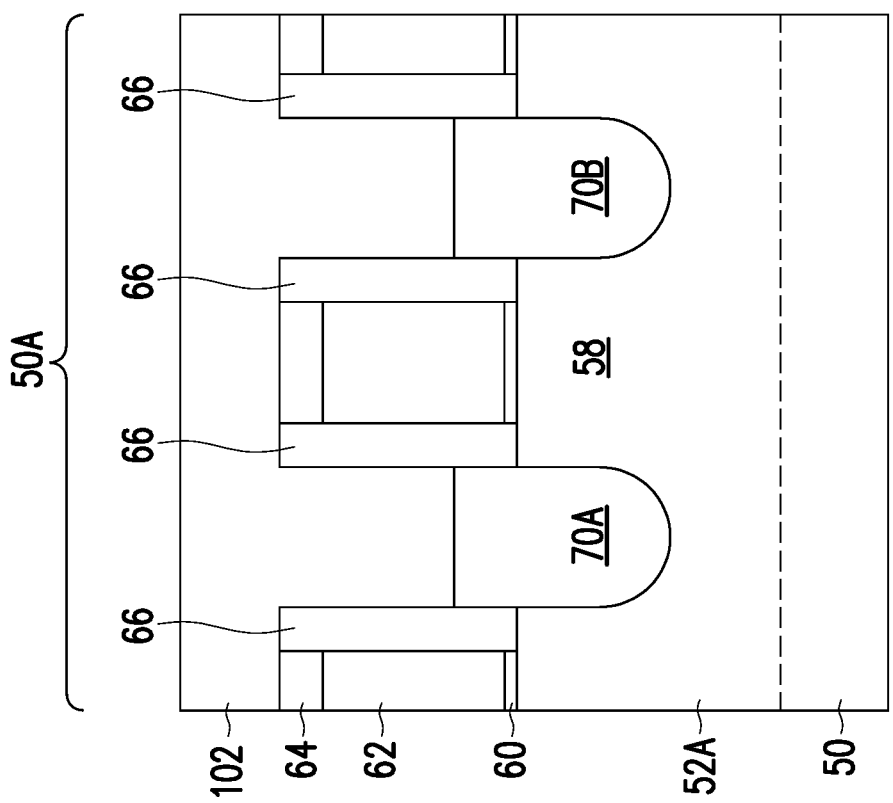

In FIGS. 4A and 4B, a first ILD layer 102 is deposited over the intermediate structure. The first ILD layer 102 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) (not shown) is disposed between the first ILD layer 102 and the epitaxial source/drain materials 70A and 70B, the masks 64, and the gate spacers 66. The CESL may comprise a dielectric material, such as, silicon nitride, silicon oxide, silicon oxynitride, or the like, having a different etch rate than the material of the first ILD layer 102.

Figure 5B:
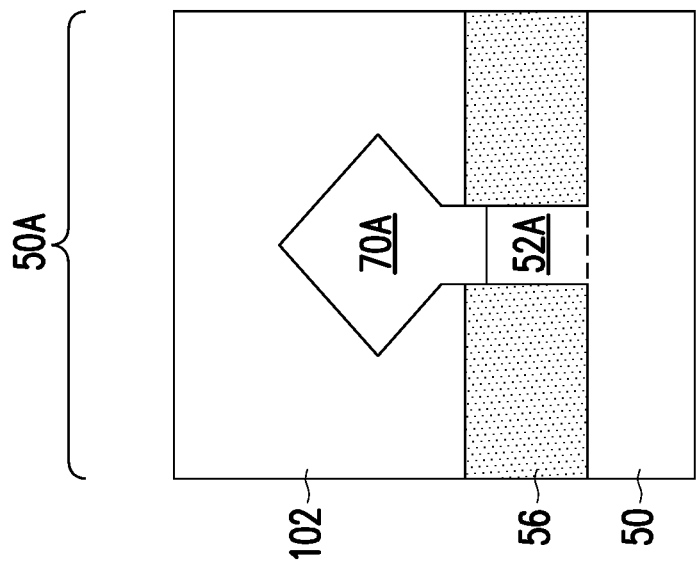
Figure 5A:
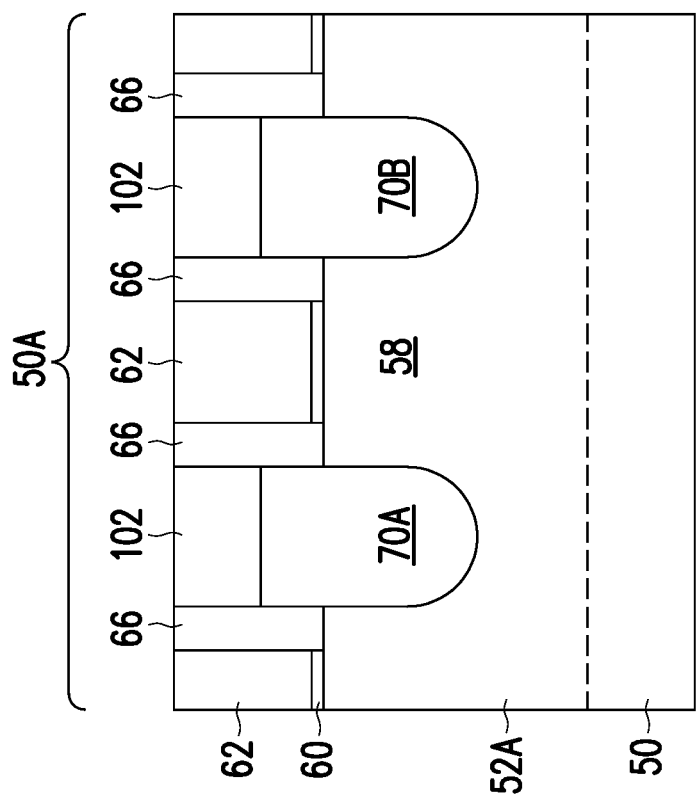

In FIGS. 5A and 5B, a planarization process, such as a CMP, may be performed to level the top surface of the first ILD layer 102 with the top surfaces of the dummy gates 62 or the masks 64. The planarization process may also remove the masks 64 on the dummy gates 62, and portions of the gate spacers 66 along sidewalls of the masks 64. After the planarization process, top surfaces of the dummy gates 62, the gate spacers 66, and the first ILD layer 102 are level. Accordingly, the top surfaces of the dummy gates 62 are exposed through the first ILD layer 102. In some embodiments, the masks 64 may remain, in which case the planarization process levels the top surface of the first ILD layer 102 with the top surfaces of the masks 64.

Figure 6B:
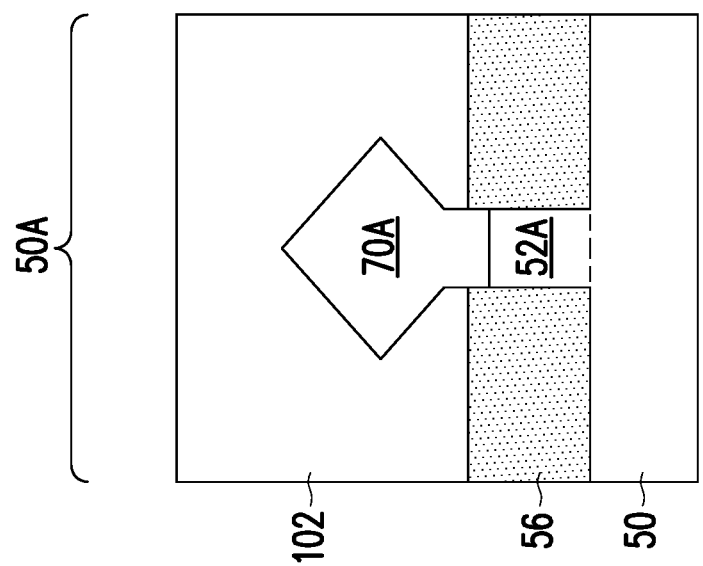
Figure 6A:
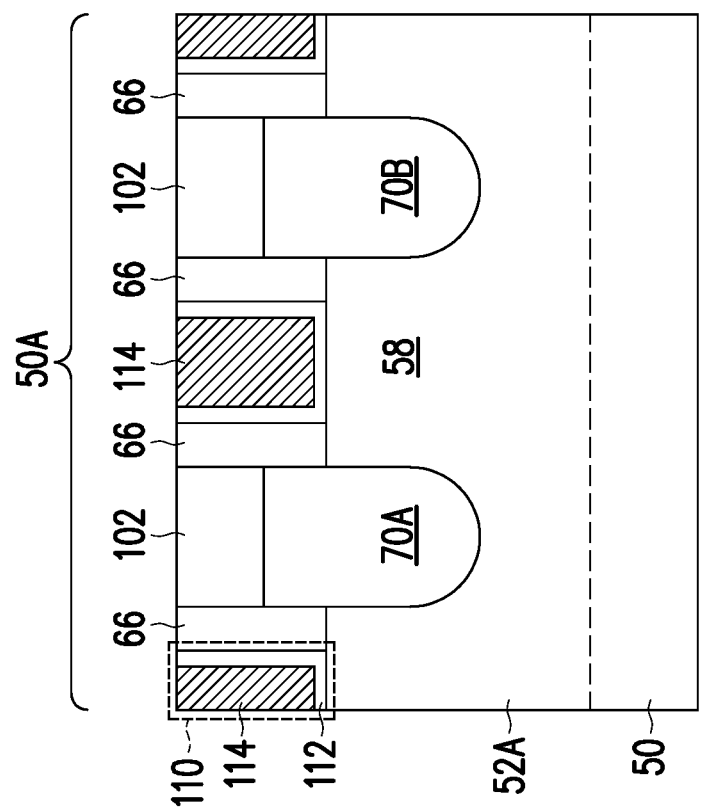

In FIGS. 6A and 6B, the dummy gates 62 are removed and are replaced with metal gates 110. The metal gates 110 include gate dielectrics 112 and gate electrodes 114. As an example to form the metal gates 110, the dummy gates 62, and the masks 64 if present, are removed in one or more etching step(s), so that recesses are formed. Portions of the dummy gate dielectrics 60 in the recesses may also be removed. In some embodiments, the dummy gates 62 are removed by an anisotropic dry etch process. For example, the etching process may include a dry etch process using reaction gas(es) that selectively etch the dummy gates 62 without etching the first ILD layer 102 or the gate spacers 66. The recesses expose the fin 52A. Specifically, the channel regions 58 are exposed by the recesses. Channel region 58 is disposed between neighboring pairs of the epitaxial source/drain materials 70A and 70B. During the removal, the dummy gate dielectrics 60 may be used as etch stop layers when the dummy gates 62 are etched. The dummy gate dielectrics 60 may then be optionally removed after the removal of the dummy gates 62.

After the removal, the gate dielectrics 112 are deposited conformally in the recesses, such as on the top surfaces and the sidewalls of the fin 52A and on sidewalls of the gate spacers 66. The gate dielectrics 112 may also be formed on top surface of the first ILD layer 102. In accordance with some embodiments, the gate dielectrics 112 comprise silicon oxide, silicon nitride, or multilayers thereof. In some embodiments, the gate dielectrics 112 include a high-k dielectric material, and in these embodiments, the gate dielectrics 112 may have a k value greater than about 7.0, and may include a metal oxide or a silicate of Hf, Al, Zr, La, Mg, Ba, Ti, Pb, and combinations thereof. The formation methods of the gate dielectrics 112 may include Molecular-Beam Deposition (MBD), atomic layer deposition (ALD), PECVD, and the like. The gate electrodes 114 are deposited over the gate dielectrics 112, respectively, and fill the remaining portions of the recesses. The gate electrodes 114 may include a metal-containing material such as TiN, TiO, TaN, TaC, Co, Ru, Al, W, combinations thereof, or multilayers thereof. For example, although a single-layered gate electrode 114 is illustrated, each gate electrode 114 may comprise any number of liner layers, any number of work function tuning layers, and a fill material. After the filling of the gate electrodes 114, a planarization process, such as a CMP, may be performed to remove the excess portions of the gate dielectrics 112 and the material of the gate electrodes 114, which excess portions are over the top surface of the first ILD layer 102. The remaining portions of material of the gate electrodes 114 and the gate dielectrics 112 thus form replacement gates of the resulting FinFETs. The metal gates 110 may be also referred to as "gate stacks" or "replacement gate stacks." The metal gates 110 may extend along sidewalls of the channel regions 58 of the fin 52A.

The formation of the gate dielectrics 112 in the region 50A and the region 50B may occur simultaneously such that the gate dielectrics 112 in each region are formed from the same materials, and the formation of the gate electrodes 114 may occur simultaneously such that the gate electrodes 114 in each region are formed from the same materials. In some embodiments, the gate dielectrics 112 in each region may be formed by distinct processes, such that the gate dielectrics 112 may be different materials, and/or the gate electrodes 114 in each region may be formed by distinct processes, such that the gate electrodes 114 may be different materials.

Figure 7B:
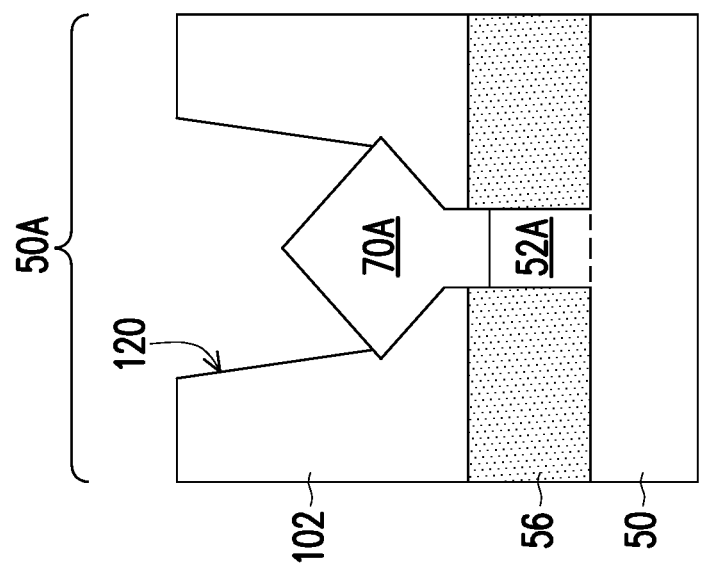
Figure 7A:
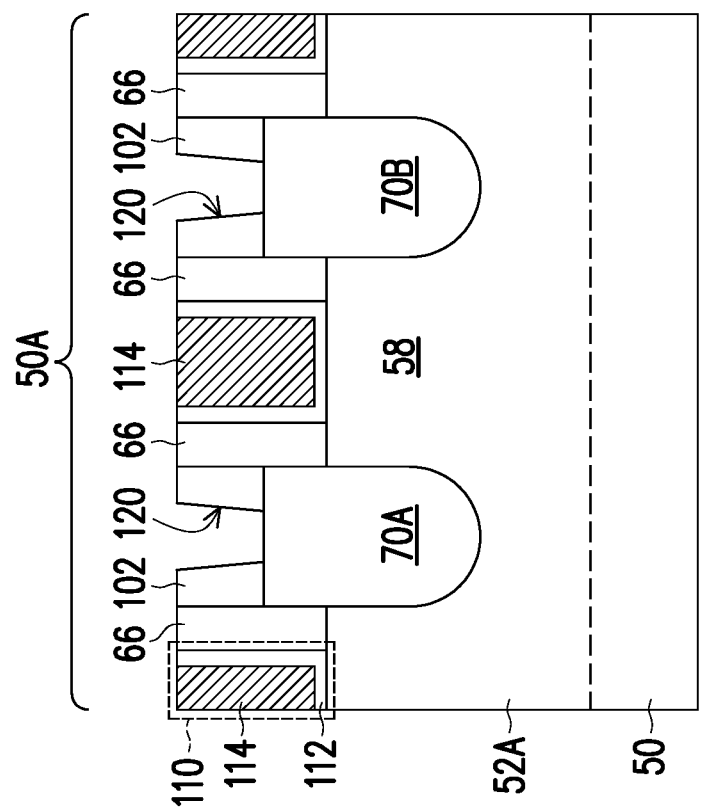

In FIGS. 7A and 7B, contact openings 120 are formed through the first ILD layer 102 and the CESL, exposing the epitaxial source/drain materials 70A and 70B. The contact openings 120 may be formed using acceptable photolithography and etching techniques.

Figure 8B:
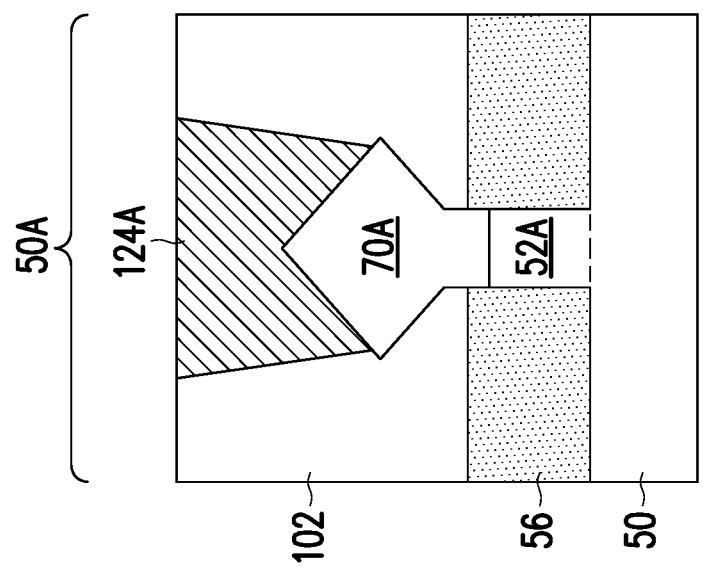
Figure 8A:
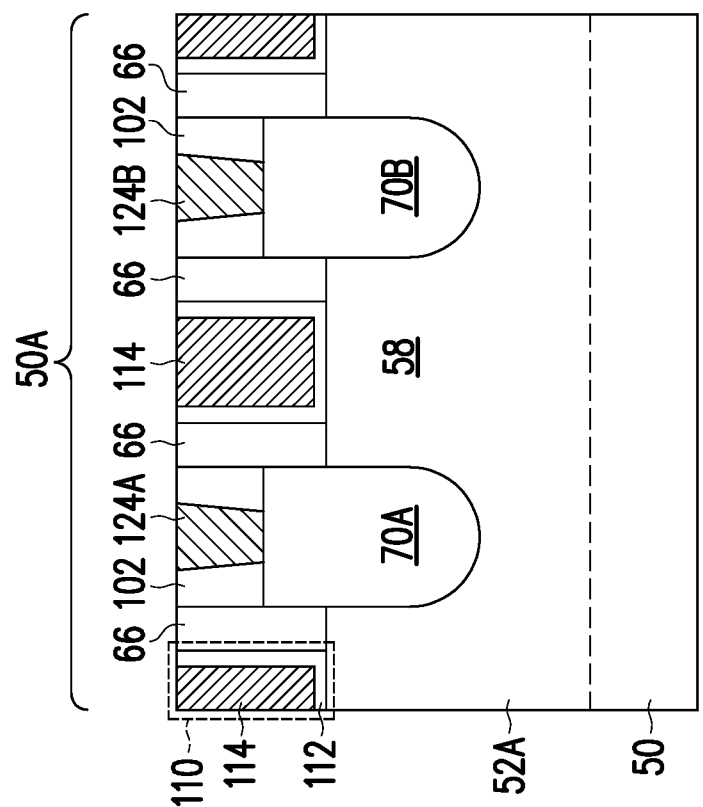

In FIGS. 8A and 8B, lower source/drain contacts 124A and 124B are formed in the contact openings 120. A liner, such as a diffusion barrier layer, an adhesion layer, or the like, and a conductive material are formed in the contact openings 120. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the first ILD layer 102. The remaining liner and conductive material form the lower source/drain contacts 124A and 124B in the contact openings 120. The lower source/drain contacts 124A and 124B are physically and electrically coupled to the epitaxial source/drain materials 70A and 70B.

Figure 9B:
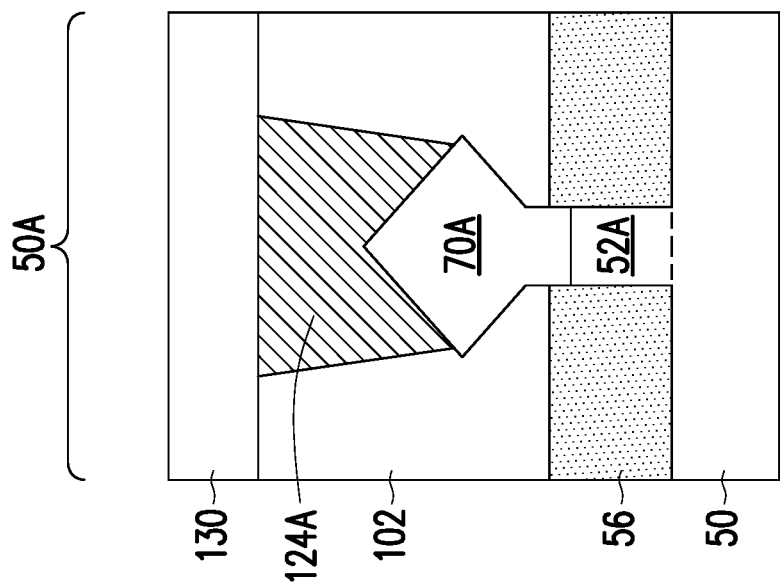
Figure 9A:
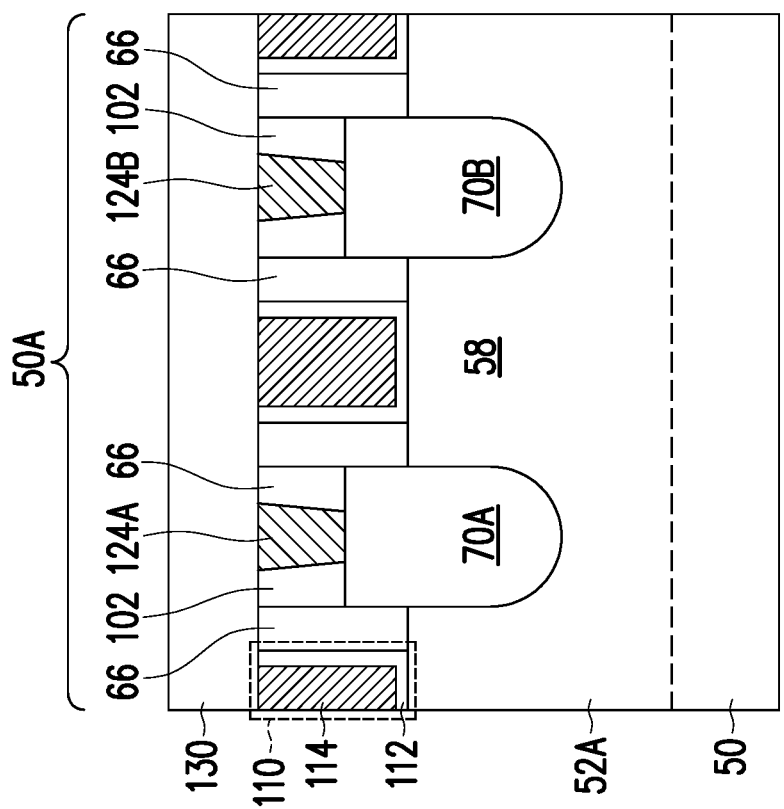

In FIGS. 9A and 9B, a second ILD layer 130 is deposited over the first ILD layer 102 and lower source/drain contacts 124A and 124B. In some embodiment, the second ILD layer 130 is a flowable film formed by a flowable CVD method. In some embodiments, the second ILD layer 130 is formed of a dielectric material such as PSG, BSG, BPSG, USG, or the like, and may be deposited by any suitable method, such as CVD and PECVD.

Figure 10B:
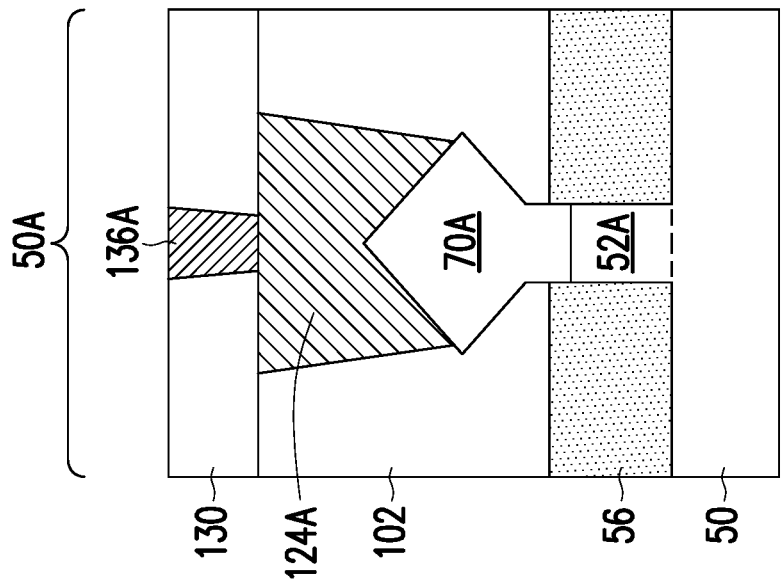
Figure 10A:
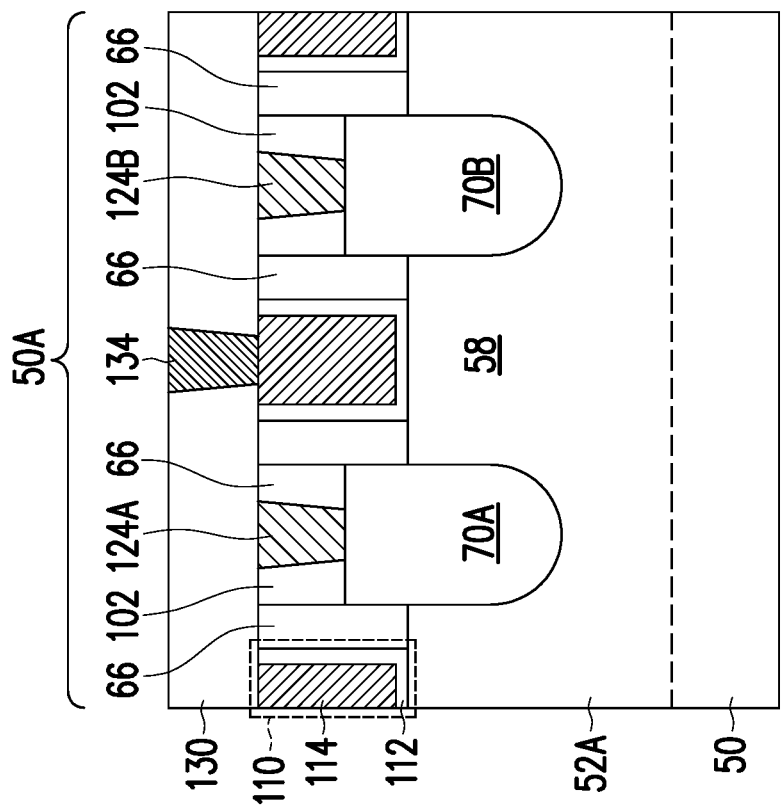

In FIGS. 10A and 10B, gate contacts 134 and upper source/drain contacts 136A and 136B are formed through the second ILD layer 130. Openings for the gate contacts 134 and upper source/drain contacts 136A and 136B are formed through the second ILD layer 130. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 130. The remaining liner and conductive material form the gate contacts 134 and upper source/drain contacts 136A and 136B in the openings. The upper source/drain contacts 136A and 136B are physically and electrically coupled to the lower source/drain contacts 124A and 124B, respectively, and the gate contacts 134 are physically and electrically coupled to the metal gates 110. The gate contacts 134 and upper source/drain contacts 136A and 136B may be formed in different processes, or may be formed in the same process.

Figure 11:
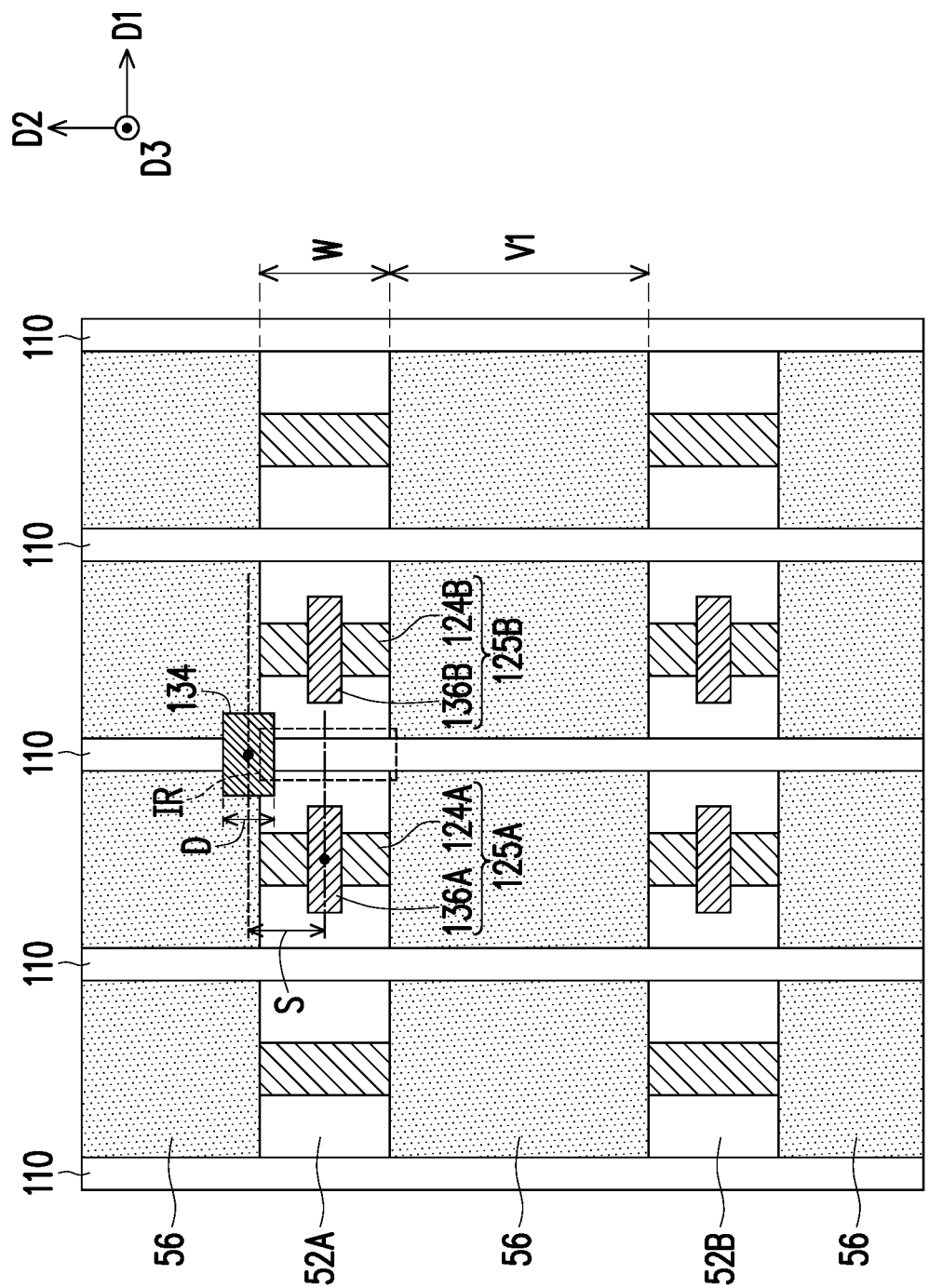
FIGS. 11-15 are schematic top views of semiconductor structures, in accordance with some embodiments.

FIG. 11 illustrates a schematic top view of the semiconductor structure in FIGS. 10A and 10B. In FIG. 11, some features of the FinFETs, such as the source/drain materials 70A and 70B, are omitted for illustration clarity. Referring to FIGS. 10A, 10B, and 11, the semiconductor structure may include an insulator 56, a first semiconductor fin 52A, a gate stack 110, a first source/drain material 70A, and a second source/drain material 70B. The first semiconductor fin 52A protrudes from the insulator 56. The gate stack 110 is disposed on the first semiconductor fin 52A and the insulator 56. The gate stack 110 may cover the insulator 56 and an intersect region IR of the first semiconductor fin 52A. In some embodiments, the gate stack 110 wraps the intersect region IR of the first semiconductor fin 52A. The first semiconductor fin 52A substantially extends along a first direction D1, and the gate stack 110 substantially extends along a second direction D2 different from the first direction D1. In some embodiments, the first direction D1 is perpendicular to the second direction D2. The first source/drain material 70A and the second source/drain material 70B may be disposed on the first semiconductor fin 52A and on opposite sides of the intersect region IR of the first semiconductor fin 52A.

The semiconductor structure may further include a gate contact 134, a first source/drain contact structure 125A, and a second source/drain contact structure 125B. The gate contact 134 is disposed on and electrically connected to the gate stack 110. In some embodiments, a ratio between the dimension of the gate contact 134 and a width of the gate stack 110 is from about 2.4 to about 3.2. The first source/drain contact structure 125A may be disposed on and electrically connected to the first source/drain material 70A, and the second source/drain contact structure 125B may be disposed on and electrically connected to the second source/drain material 70B. The first source/drain contact structure 125A and the second source/drain contact structure 125B are disposed on opposite sides of the intersect region IR of the first semiconductor fin 52A. The first source/drain contact structure 125A and the second source/drain contact structure 125B may be symmetry with respect to the gate stack 110.

Specifically, the first source/drain contact structure 125A may include a lower source/drain contact 124A and an upper source/drain contact 136B, and the second source/drain contact structure 125B may include a lower source/drain contact 124B and an upper source/drain contact 136B. The upper source/drain contact 136A may be disposed on and electrically connected to the lower source/drain contact 124A, and the upper source/drain contact 136B may be disposed on and electrically connected to the lower source/drain contact 124B. In some embodiments, as shown in FIG. 11, the upper source/drain contact 136A may not overlap with the gate contact 134 in the first direction D1, and the upper source/drain contact 136B may not overlap with the gate contact 134 in the first direction D1, either.

Referring to FIG. 11, an offset S in the second direction D2 may exists between the gate contact 134 and a source/drain contact structure, e.g., the first source/drain contact structure 125A. As shown in FIG. 11, the offset S is determined by the offset in the second direction D2 between the center of the gate contact 134 and the center of the first source/drain contact structure 125A. Under another aspect, the offset S may be considered as an offset in a lengthwise direction of the gate stack 110 between the gate contact 134 and the first source/drain contact structure 125A. Under yet another aspect, the offset S may be considered as an offset in a widthwise direction of the first semiconductor fin 52A between the gate contact 134 and the first source/drain contact structure 125A. In some embodiments, the offset S satisfied: $0 < S \leq (W/2 + D/2)$, wherein W is a width of the first semiconductor fin 52A, and D is a dimension of the gate contact 134. Such relative configuration between the gate contact and the source/drain contact structure may increase design flexibility and reduce occupied area of the device, while the performance of the semiconductor device, e.g., the resulting FinFETs, may be more predictable and more reliable.

As shown in FIG. 11, the gate contact 134 and the first semiconductor fin 52A may overlap in a stacking direction D3 of the semiconductor structure. Under another aspect, the gate contact 134 and the intersect region IR of the first semiconductor fin 52A may overlap in a direction perpendicular to the lengthwise direction of the gate stack 110 and a lengthwise direction of the first semiconductor fin 52A. As shown in FIG. 11, the gate contact 134 and the insulator 56 may overlap in a stacking direction D3 of the semiconductor structure as well.

In some embodiments, the semiconductor structure may further include a second semiconductor fin 52B protruding from the insulator 56. The second semiconductor fin 52B may substantially extend along the first direction D1, and may be of similar width and similar height as the first semiconductor fin 52A. The gate stack 110 may disposed on both the first semiconductor fin 52A and the second semiconductor fin 52B. In some embodiments, an interval VI between the first semiconductor fin 52A and the second semiconductor fin 52B, which can be determined by a shortest distance between the first semiconductor fin 52A and the second semiconductor fin 52B, may be from about 0.07 μm to about 0.08 μm.

FIGS. 12-15 illustrate schematic top views of semiconductor structures that are similar to the semiconductor structure illustrated in FIGS. 10A, 10B, and 11, with like elements labeled with like numerical references. In some embodiments, the semiconductor structures of FIGS. 12-15 may be formed using similar materials and methods as the semiconductor structure of FIGS. 10A, 10B, and 11, described above with reference to FIGS. 1-10B, and the description is not repeated herein for the sake of brevity.

Figure 12:
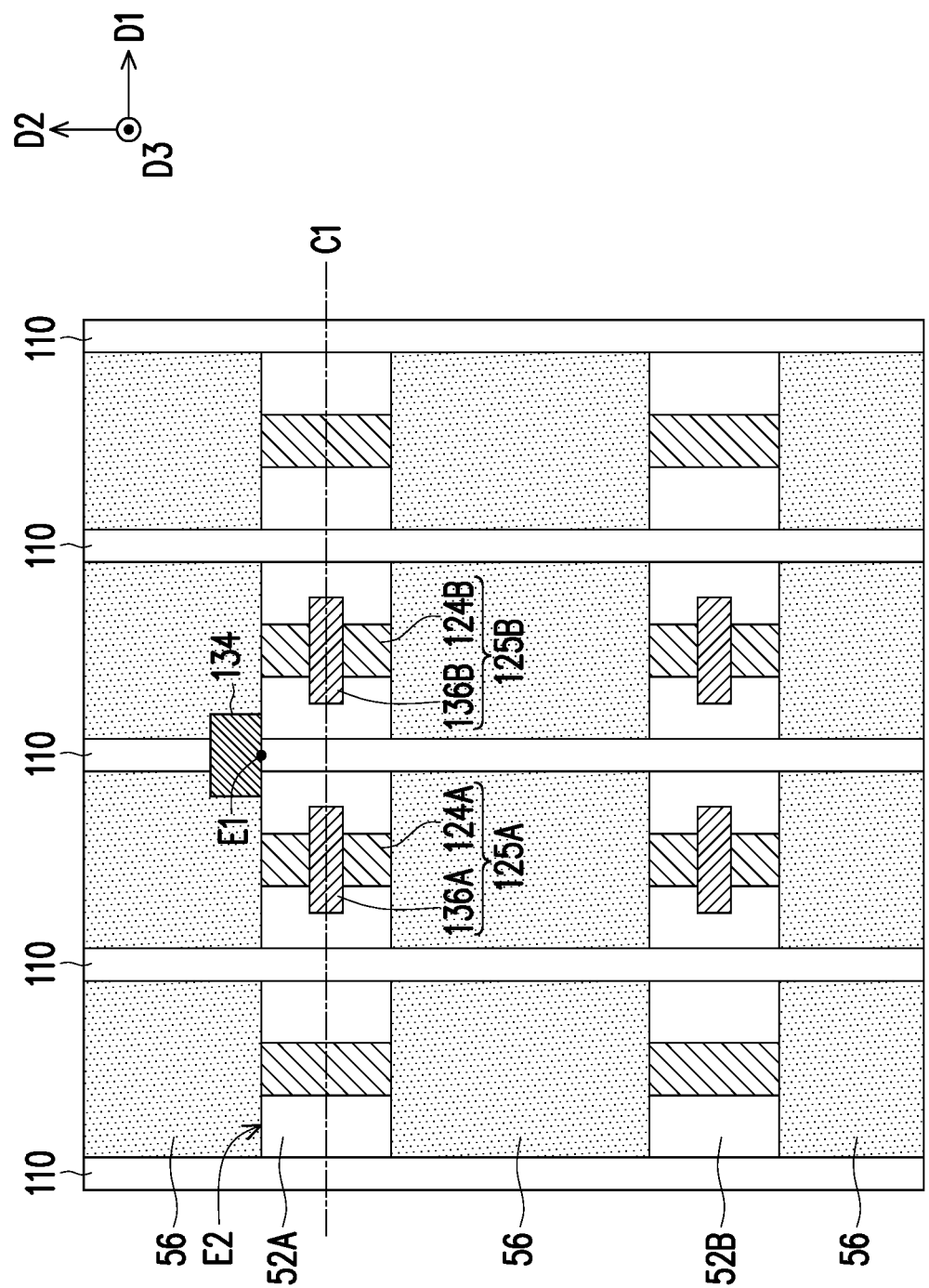
Figure 13:
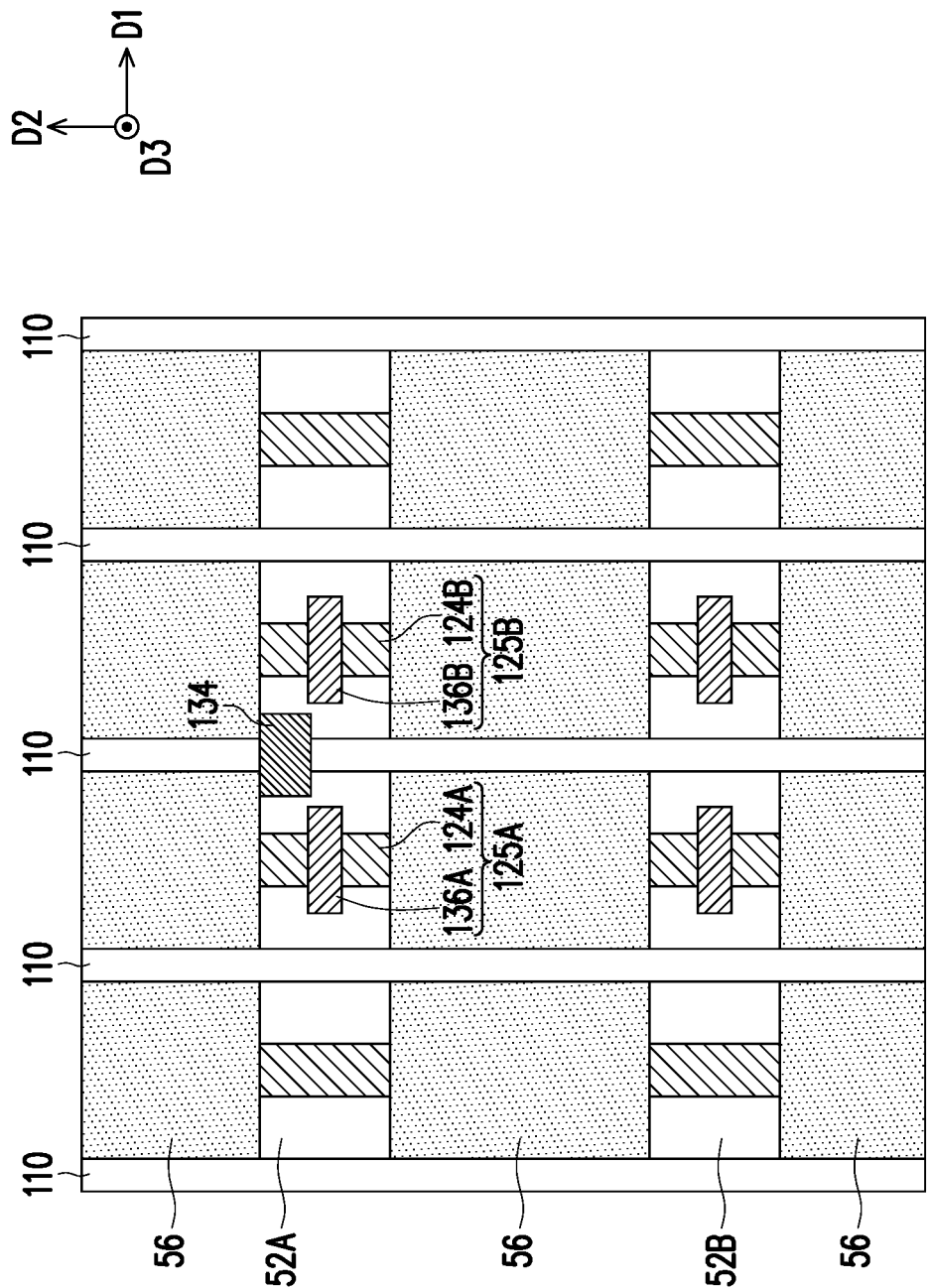

Referring to FIG. 12, a first end E1 of the gate contact 134 is aligned with an edge E2 of the first semiconductor fin 52A in the stacking direction D3 of the semiconductor structure, wherein the first end E1 is an end of the gate contact 134 having a minimum distance between the end E1 and a central axis C1 of the first semiconductor fin 52A. Under another aspect, an interval in the lengthwise direction of the gate stack 110 between the first end E1 of the gate contact 134 and an edge E2 of the first semiconductor fin 52A is zero. Referring to FIG. 13, in some embodiments, the gate contact 134 and the insulator 56 may not overlap in the stacking direction D3 of the semiconductor structure.

Figure 14:
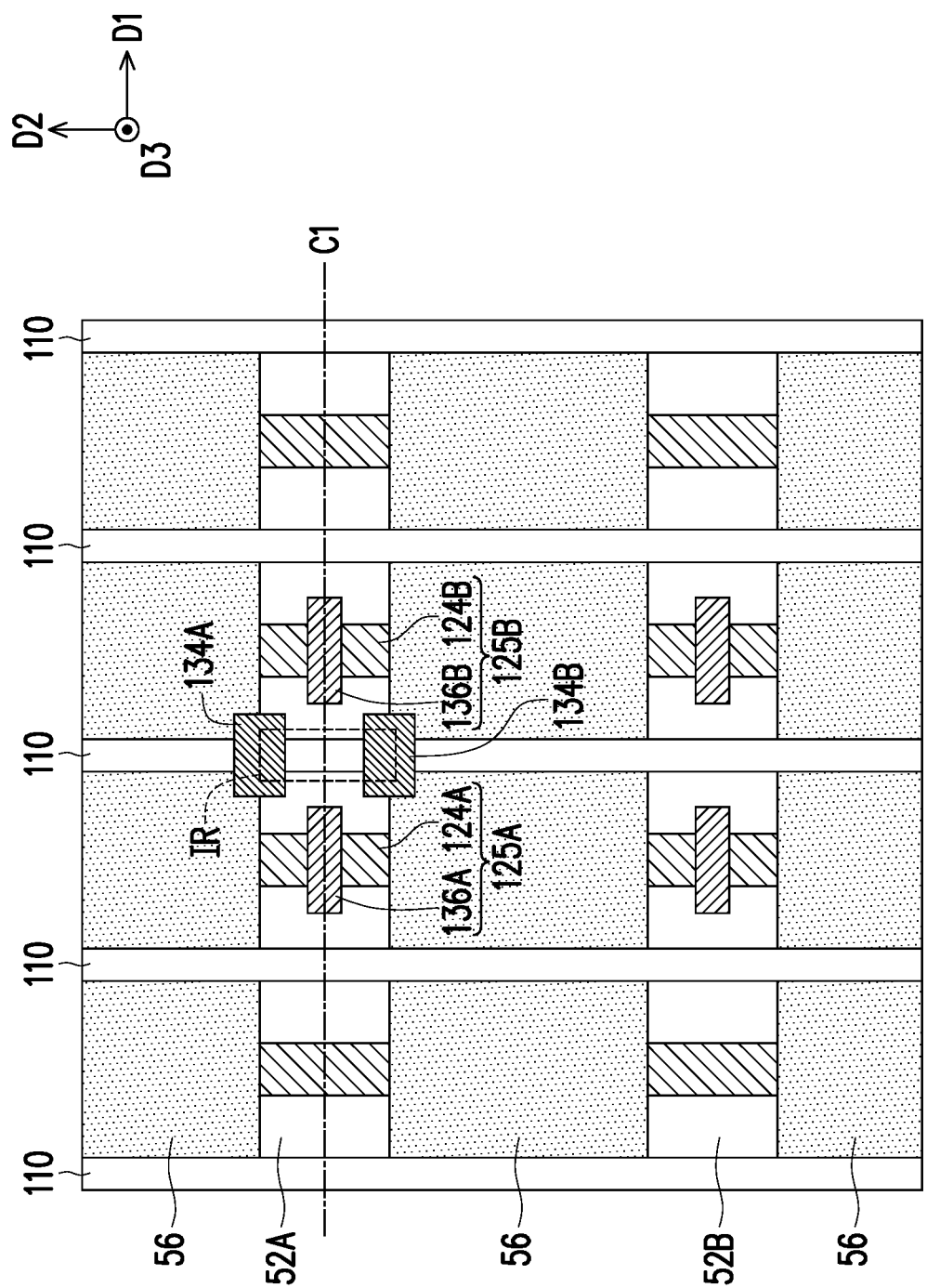

Referring to FIG. 14, in some embodiments, the semiconductor structure may include a first gate contact 134A similar to the gate contact 134 shown in FIG. 11, and may further include a second gate contact 134B disposed on and electrically connected to the gate stack 110. In some embodiments, the second gate contact 134B and the intersect region IR of the first semiconductor fin 52A may overlap in a direction perpendicular to the lengthwise direction of the gate stack 110 and a lengthwise direction of the first semiconductor fin 52A, e.g., in the direction D3 shown in FIG. 14. In some embodiments, the first gate contact 134A and the second gate contact 134B may be symmetry with respect to a central axis C1 of the first semiconductor fin 52A. The symmetrical arrangement of the first gate contact 134A and the second gate contact 134 may provide a semiconductor device with more favorable and controllable feature.

Figure 15:
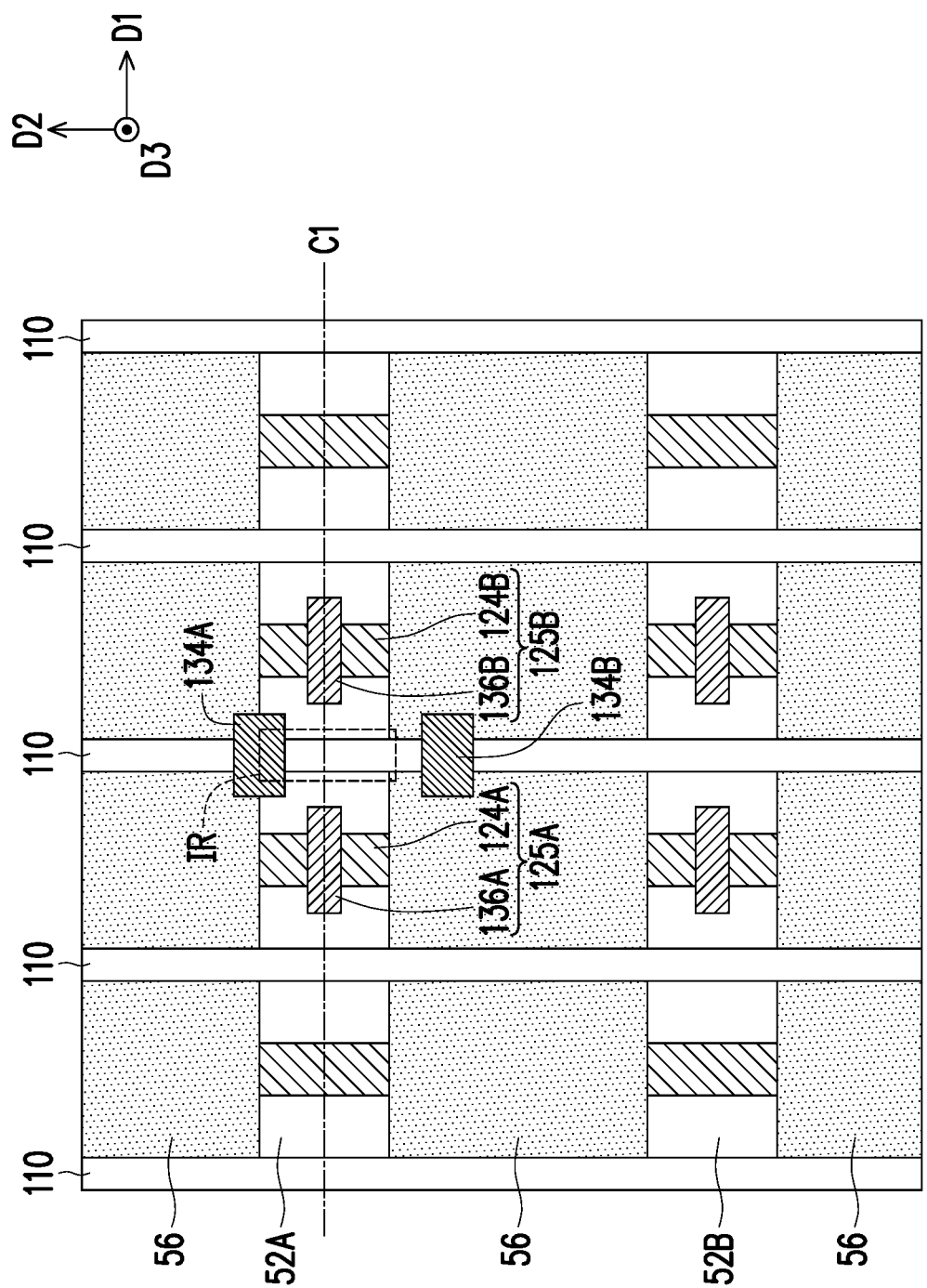

Referring to FIG. 15, in some embodiments, the second gate contact 134B and the intersect region IR of the first semiconductor fin 52A may not overlap in a direction perpendicular to the lengthwise direction of the gate stack 110 and a lengthwise direction of the first semiconductor fin 52A, e.g., in the direction D3 shown in FIG. 15. In some embodiments, the first gate contact 134A and the second gate contact 134B may be asymmetry with respect to a central axis C1 of the first semiconductor fin 52A.

In the above-mentioned semiconductor structure, with the relative configuration between the gate contact and the source/drain contact structure fulfilling certain conditions, the design flexibility of the devices may be increased and the occupied area of the device may be reduced, while the performance of the semiconductor device may be more predictable and more reliable.

In accordance with some embodiments of the present disclosure, a semiconductor structure includes an insulator, a semiconductor fin, a gate stack, a gate contact, a source/drain material, and a source/drain contact structure. The semiconductor fin protrudes from the insulator. The gate stack is disposed on the semiconductor fin and the insulator. The gate contact is disposed on and electrically connected to the gate stack. The source/drain material is disposed on the semiconductor fin. The source/drain contact structure is disposed on and electrically connected to the source/drain material. The semiconductor fin extends along a first direction, the gate stack extends along a second direction different from the first direction. An offset S in the second direction between the gate contact and the source/drain contact structure satisfies: $0 < S \leq (W/2 + D/2)$, wherein W is a width of the semiconductor fin, and D is a dimension of the gate contact. In some embodiments, the first direction is perpendicular to the second direction. In some embodiments, the gate contact and the semiconductor fin overlap in a stacking direction of the semiconductor structure. In some embodiments, the gate contact and the insulator do not overlap in a stacking direction of the semiconductor structure. In some embodiments, the gate contact and the insulator overlap in a stacking direction of the semiconductor structure. In some embodiments, the gate contact includes a first end having a minimum distance between the first end and a central axis of the semiconductor fin, and the first end of the gate contact is aligned with an edge of the semiconductor fin in a stacking direction of the semiconductor structure. In some embodiments, the source/drain contact structure includes a lower source/drain contact and an upper source/drain contact electrically connected to the lower source/drain contact. In some embodiments, the upper source/drain contact is not overlapped with the gate contact in the first direction.

In accordance with some embodiments of the present disclosure, a semiconductor structure includes an insulator, a first semiconductor fin, a gate stack, a first gate contact, a source/drain material, and a source/drain contact structure. The first semiconductor fin protrudes from the insulator. The gate stack covers the insulator and an intersect region of the first semiconductor fin. The first gate contact is disposed on and electrically connected to the gate stack. The source/drain material is disposed on the first semiconductor fin. The source/drain contact structure is disposed on and electrically connected to the source/drain material. An offset S in a lengthwise direction of the gate stack between the first gate contact and the source/drain contact structure satisfies: $0 < S \leq (W/2 + D/2)$, wherein W is a width of the first semiconductor fin, and D is a dimension of the first gate contact. In some embodiments, the first gate contact and the intersect region of the first semiconductor fin overlap in a direction perpendicular to the lengthwise direction of the gate stack and a lengthwise direction of the first semiconductor fin. In some embodiments, the first gate contact includes a first end having a minimum distance between the first end and a central axis of the first semiconductor fin, and an interval in the lengthwise direction of the gate stack between the first end of the first gate contact and an edge of the first semiconductor fin is zero. In some embodiments, the semiconductor structure further includes a second semiconductor fin protruding from the insulator, wherein the gate stack is disposed on the second semiconductor fin. In some embodiments, an interval between the first semiconductor fin and the second semiconductor fin is from about 0.07 μm to about 0.08 μm. In some embodiments, the semiconductor structure further includes a second gate contact disposed on and electrically connected to the gate stack. In some embodiments, the second gate contact and the intersect region of the first semiconductor fin overlap in a direction perpendicular to the lengthwise direction of the gate stack and a lengthwise direction of the first semiconductor fin. In some embodiments, the first gate contact and the second gate contact are symmetry with respect to a central axis of the first semiconductor fin.

In accordance with some embodiments of the present disclosure, a semiconductor structure includes a semiconductor fin, a gate stack, a gate contact, a first source/drain material and a second source/drain material, and a first source/drain contact structure. The gate stack wraps an intersect region of the semiconductor fin. The gate contact is disposed on and electrically connected to the gate stack. The first source/drain material and the second source/drain material are disposed on the semiconductor fin and on opposite sides of the intersect region of the semiconductor fin. The first source/drain contact structure is disposed on and electrically connected to the first source/drain material. An offset S between the gate contact and the first source/drain contact structure in a widthwise direction of the semiconductor fin satisfies: $0<S\leq(W/2+D/2)$, wherein W is a half of a width of the semiconductor fin, and D is a half of a dimension of the gate contact. In some embodiments, the semiconductor structure further includes a second source/drain contact structure disposed on and electrically connected to the second source/drain material, wherein the first source/drain contact structure and the second source/drain contact structure are disposed on opposite sides of the intersect region of the semiconductor fin. In some embodiments, the first source/drain contact structure and the second source/drain contact structure are symmetry with respect to the gate stack. In some embodiments, a ratio between the dimension of the gate contact and a width of the gate stack is from about 2.4 to about 3.2.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
an insulator;
a semiconductor fin protruding from the insulator;
a gate stack disposed on the semiconductor fin and the insulator;
a gate contact disposed on and electrically connected to the gate stack;
a source/drain material disposed on the semiconductor fin; and
a source/drain contact structure disposed on and electrically connected to the source/drain material;
wherein the semiconductor fin extends along a first direction, the gate stack extends along a second direction different from the first direction, and an offset S in the second direction between the gate contact and the source/drain contact structure satisfied: $0<S\leq(W/2+D/2)$, wherein W is a width of the semiconductor fin, and D is a dimension of the gate contact.

2. The semiconductor structure of claim 1, wherein the first direction is perpendicular to the second direction.

3. The semiconductor structure of claim 1, wherein the gate contact and the semiconductor fin overlap in a stacking direction of the semiconductor structure.

4. The semiconductor structure of claim 1, wherein the gate contact and the insulator do not overlap in a stacking direction of the semiconductor structure.

5. The semiconductor structure of claim 1, wherein the gate contact and the insulator overlap in a stacking direction of the semiconductor structure.

6. The semiconductor structure of claim 1, wherein the gate contact includes a first end having a minimum distance between the first end and a central axis of the semiconductor fin, and the first end of the gate contact is aligned with an edge of the semiconductor fin in a stacking direction of the semiconductor structure.

7. The semiconductor structure of claim 1, wherein the source/drain contact structure comprises a lower source/drain contact and an upper source/drain contact electrically connected to the lower source/drain contact.

8. The semiconductor structure of claim 7, wherein the upper source/drain contact is not overlapped with the gate contact.

9. A semiconductor structure, comprising:
an insulator;
a first semiconductor fin protruding from the insulator;
a gate stack covering the insulator and an intersect region of the first semiconductor fin;
a first gate contact disposed on and electrically connected to the gate stack;
a source/drain material disposed on the first semiconductor fin; and
a source/drain contact structure disposed on and electrically connected to the source/drain material;
wherein an offset S in a lengthwise direction of the gate stack between the first gate contact and the source/drain contact structure satisfied: $0<S\leq(W/2+D/2)$, wherein W is a width of the first semiconductor fin, and D is a dimension of the first gate contact.

10. The semiconductor structure of claim 9, wherein the first gate contact and the intersect region of the first semiconductor fin overlap.

11. The semiconductor structure of claim 9, wherein the first gate contact includes a first end having a minimum distance between the first end and a central axis of the first semiconductor fin, and an interval in the lengthwise direction of the gate stack between the first end of the first gate contact and an edge of the first semiconductor fin is zero.

12. The semiconductor structure of claim 9, further comprising a second semiconductor fin protruding from the insulator, wherein the gate stack is disposed on the second semiconductor fin.

13. The semiconductor structure of claim 12, wherein an interval between the first semiconductor fin and the second semiconductor fin is from about 0.07 µm to about 0.08 µm.

14. The semiconductor structure of claim 9, further comprising a second gate contact disposed on and electrically connected to the gate stack.

15. The semiconductor structure of claim 14, wherein the second gate contact and the intersect region of the first semiconductor fin overlap.

16. The semiconductor structure of claim 14, wherein the first gate contact is symmetrical with the second gate contact with respect to a central axis of the first semiconductor fin.

17. A semiconductor structure, comprising:
a semiconductor fin;
a gate stack wrapping an intersect region of the semiconductor fin;
a gate contact disposed on and electrically connected to the gate stack;
a first source/drain material and a second source/drain material disposed on the semiconductor fin and on opposite sides of the intersect region of the semiconductor fin; and
a first source/drain contact structure disposed on and electrically connected to the first source/drain material;
wherein an offset S between the gate contact and the first source/drain contact structure in a widthwise direction of the semiconductor fin satisfied: $0<S\leq(W/2+D/2)$, wherein W is a half of a width of the semiconductor fin, and D is a half of a dimension of the gate contact.

18. The semiconductor structure of claim 17, further comprising a second source/drain contact structure disposed on and electrically connected to the second source/drain material, wherein the first source/drain contact structure and the second source/drain contact structure are disposed on opposite sides of the intersect region of the semiconductor fin.

19. The semiconductor structure of claim 18, wherein the first source/drain contact structure is symmetrical with the second source/drain contact structure with respect to the gate stack.

20. The semiconductor structure of claim 17, wherein a ratio between the dimension of the gate contact and a width of the gate stack is from about 2.4 to about 3.2.

* * * * *